United States Patent
Lv

(10) Patent No.: US 12,516,680 B2
(45) Date of Patent: Jan. 6, 2026

(54) FAN MODULE MOUNTING DEVICE AND SERVER

(71) Applicant: SUZHOU METABRAIN INTELLIGENT TECHNOLOGY CO., LTD., Jiangsu (CN)

(72) Inventor: Heng Lv, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/723,527

(22) PCT Filed: Feb. 28, 2023

(86) PCT No.: PCT/CN2023/078834
§ 371 (c)(1),
(2) Date: Jun. 24, 2024

(87) PCT Pub. No.: WO2024/055533
PCT Pub. Date: Mar. 21, 2024

(65) Prior Publication Data
US 2025/0059985 A1    Feb. 20, 2025

(30) Foreign Application Priority Data

Sep. 15, 2022  (CN) .......................... 202211119228.3

(51) Int. Cl.
*F04D 29/64* (2006.01)
*F04D 19/00* (2006.01)
*H05K 7/20* (2006.01)

(52) U.S. Cl.
CPC ......... *F04D 29/646* (2013.01); *F04D 19/002* (2013.01); *H05K 7/20172* (2013.01); *H05K 7/20718* (2013.01)

(58) Field of Classification Search
CPC .... F04D 29/646; F04D 19/002; F04D 29/601; H05K 7/20172; H05K 7/20718; Y02E 10/72; G06F 1/181; G06F 1/183
See application file for complete search history.

(56) References Cited

U.S. PATENT DOCUMENTS

| 6,040,981 A | * | 3/2000 | Schmitt ...................... G06F 1/18 361/679.48 |
| 6,236,564 B1 | * | 5/2001 | Fan ..................... H05K 7/20581 312/236 |

(Continued)

FOREIGN PATENT DOCUMENTS

| CN | 2791737 Y | 6/2006 |
| CN | 101847927 A | 9/2010 |

(Continued)

OTHER PUBLICATIONS

Translation of PCT International Search Report mailed on Jun. 15, 2023 for PCT/CN2023/078834 (3 pages).

(Continued)

*Primary Examiner* — Aaron R Eastman
(74) *Attorney, Agent, or Firm* — Merchant & Gould P.C.

(57) ABSTRACT

A fan module mounting device includes a positioning and connection base fixed inside a case; a bottom surface of a connecting end of a rotary mounting cylinder is hinged to the positioning and connection base; and a pick-and-place end of the rotary mounting cylinder is provided with a passage for a fan to enter and exit. The positioning and connection base is provided with a blocking and locking snap; in the working state, the blocking and locking snap blocks and limits the fan, thereby limiting the fan and ensuring that the fan cannot move out from the rotary mounting cylinder. During dismounting, it is only necessary to release the limiting of the blocking and locking snap on the rotary (Continued)

mounting cylinder, the rotary mounting cylinder is rotated and lifted upward, the fan is picked from the rotary mounting cylinder.

19 Claims, 8 Drawing Sheets

(56) References Cited

U.S. PATENT DOCUMENTS

| | | | |
|---|---|---|---|
| 6,317,320 B1 | 11/2001 | Cosley et al. | |
| 6,587,342 B1* | 7/2003 | Hsu | G06F 1/20 |
| | | | 415/213.1 |
| 8,405,989 B2* | 3/2013 | Wang | H05K 7/20172 |
| | | | 361/688 |
| 2006/0256522 A1 | 11/2006 | Wei et al. | |
| 2006/0291170 A1* | 12/2006 | Hsiao | H05K 7/20154 |
| | | | 361/704 |
| 2008/0043432 A1 | 2/2008 | Hung | |
| 2010/0247301 A1* | 9/2010 | Hatozaki | H05K 7/20918 |
| | | | 415/182.1 |
| 2015/0351280 A1 | 12/2015 | Gonzalez Inda et al. | |
| 2019/0242425 A1* | 8/2019 | Chen | F16B 35/065 |
| 2020/0396862 A1* | 12/2020 | Tsorng | F04D 25/166 |
| 2024/0044343 A1* | 2/2024 | Andersen | F04D 29/601 |
| 2024/0422937 A1* | 12/2024 | Lv | H05K 7/20172 |

FOREIGN PATENT DOCUMENTS

| | | |
|---|---|---|
| CN | 209149204 U | 7/2019 |
| CN | 209604296 U | 11/2019 |
| CN | 213839036 U | 7/2021 |
| CN | 115199591 A | 10/2022 |
| EP | 1947547 A1 | 7/2008 |
| JP | 2012244657 A | 12/2012 |
| TW | 447734 U | 7/2001 |
| TW | M306761 U | 2/2007 |
| TW | 201228543 A | 7/2012 |

OTHER PUBLICATIONS

Chinese Search Report for Application No. 2022111192283 (2 pages).

* cited by examiner

FAN MODULE MOUNTING DEVICE AND SERVER

CROSS-REFERENCE TO RELATED APPLICATION

This application is a National Stage Application of International Application No. PCT/CN2023/078834 filed on Feb. 28, 2023, which claims the benefit of Ser. No. 202211119228.3 filed on Sep. 15, 2022 in China, and which applications are incorporated herein by reference. To the extent appropriate, a claim of priority is made to each of the above disclosed applications.

TECHNICAL FIELD

The present disclosure relates to the technical field of air cooling and heat dissipation, and further relates to a fan module mounting device and a server.

BACKGROUND

A large number of integrated circuits are used in computer components, and high temperature is archenemy of integrated circuits. The high temperature not only causes unstable system operation and shortens the service life, but also makes certain components burn. Heat causing the high temperature comes from the interior of the computer, and a heat radiator absorbs the heat by contacting with the surfaces of heat-generating components, and then transfers the heat to remote places by various methods. As for air cooling and heat dissipation, fans are used to discharge hot air to the outside, thereby completing heat dissipation and ensuring normal temperature of the computer components.

The heat generation amount in a server is large, and a plurality of fans need to be provided to ensure the heat dissipation effect, and the fans need to be dismounted and mounted frequently for maintenance. A traditional fan is fixedly mounted by using bolts or latches, and generally four bolts or latches are respectively used at front and rear ends of the fan to ensure stability. Mounting of the traditional fan results in a huge workload for maintenance and dismounting and mounting of the fan, and the maintenance efficiency is low.

For a person skilled in the art, efficiently and quickly achieving the dismounting and mounting of a fan is a technical problem that currently needs to be solved.

SUMMARY

The present disclosure provides a fan module mounting device, which can conveniently and quickly complete the mounting and dismounting of a fan, thereby increasing the operation efficiency. The specific solution is as follows:

a fan module mounting device, including a positioning and connection base and a rotary mounting cylinder; wherein the positioning and connection base is fixed inside a case, a bottom surface of a connecting end of the rotary mounting cylinder is hinged to the positioning and connection base, the rotary mounting cylinder can pivot around a rotating shaft parallel to the positioning and connection base, and two pivoting extreme positions of the rotary mounting cylinder respectively correspond to a working state and a maintenance state;

a pick-and-place end of the rotary mounting cylinder away from the rotating shaft is provided with a passage for a fan to enter and exit; the positioning and connection base is provided with a blocking and locking snap; and in the working state, the blocking and locking snap is snap-fitted with and limits the pick-and-place end of the rotary mounting cylinder, and blocks and limits the fan.

In an embodiment, one positioning and connection base is assembled corresponding to one rotary mounting cylinder; or multiple independently arranged rotary mounting cylinders correspond to the same positioning and connection base.

The positioning and connection base corresponds to the rotary mounting cylinder on one-to-one basis, and each fan module mounting device is an independent structure, is not mixed with other devices, and has high standardization; multiple rotary mounting cylinders share the same positioning and connection base; and in this situation, only one positioning and connection base needs to be fixed inside the case, and the positioning and connection base does not need to be repeatedly fixed for multiple times, which can further increase the operation efficiency.

In an embodiment, the positioning and connection base is a flat plate, and is provided with fixing and connecting holes for assembling blind rivets; and the blocking and locking snap protrudes upwards and is arranged at an edge of an upper surface of the positioning and connection base.

The positioning and connection base is fixedly connected to positions such as a main board, etc. inside the case by means of blind rivets, etc.; and fixing and connecting manners such as blind rivets and screws may be used.

In an embodiment, a snap-fit flange is arranged in the direction of the blocking and locking snap facing away from the positioning and connection base;

the rotary mounting cylinder is provided with a blocking and locking snap connecting handle near the edge of the pick-and-place end of the positioning and connection base; and the snap-fit flange and the blocking and locking snap connecting handle cooperate to achieve limiting and locking.

The snap-fit assembling between the snap-fit flange and the blocking and locking snap connecting handle is used to achieve a locking effect of the rotary mounting cylinder.

In an embodiment, an unlocking block is provided in a direction of the blocking and locking snap facing away from the positioning and connection base, and a vertical height of the unlocking block is higher than that of the upper surface of the positioning and connection base.

The unlocking block extends in a transverse direction, and the unlocking block is generally a flat plate-shaped structure, and the unlocking block can drive the blocking and locking snap to be elastically deformed, thereby facilitating the application of an acting force in a releasing process.

In an embodiment, a lifting elastic member is arranged between the rotary mounting cylinder and the positioning and connection base, and the lifting elastic member provides an upward elastic force to the rotary mounting cylinder.

The elastic force of the lifting elastic member is greater than the gravity of the rotary mounting cylinder itself. When the rotary mounting cylinder is unlocked, the rotary mounting cylinder tends to lift upwards under the action of the elastic force of the lifting elastic member; and as soon as the blocking and locking snap is unlocked, the rotary mounting cylinder can be lifted upward automatically without manually lifting the rotary mounting cylinder, which can further optimize the operation experience.

In an embodiment, the lifting elastic member is a torsion spring, first spring clamping blocks for clamping the lifting elastic member are arranged on the positioning and connection base, and a second spring clamping block for clamping the lifting elastic member is arranged on the bottom surface of the rotary mounting cylinder.

The structure of the torsion spring can effectively simplify the assembly process and improve the assembly convenience.

In an embodiment, a side wall of the pick-and-place end of the rotary mounting cylinder is provided with notches for avoiding fingers.

The side wall of the pick-and-place end of the rotary mounting cylinder is provided with notches for avoiding fingers; since the length of the entire rotary mounting cylinder is substantially equal to the length of the fan, acting points are small when the fan is picked, it is difficult for fingers to grip the acting points, and thus notches are provided on two opposite side walls of the rotary mounting cylinder, such that it is convenient for fingers to directly hold the fan.

In an embodiment, the connecting end of the rotary mounting cylinder is slidably provided with an ejection sliding block, wherein an inner end of the ejection sliding block is provided with inner-end limiting stop blocks, and an outer end thereof is provided with an outer-end limiting stop block; and the inner end of the ejection sliding block is in contact with the fan, and the outer end is in contact with the interior of the case and is retracted in the maintenance state, such that the fan can be ejected out.

When the inner-end limiting stop blocks contact the inner wall of the connecting end of the rotary mounting cylinder, the ejection sliding block is in a maximal outwardly-extending state; and when the outer-end limiting stop block contacts the outer wall of the connecting end of the rotary mounting cylinder, the ejection sliding block is in a maximal inwardly-extending state.

In an embodiment, the outer-end limiting stop block is annular, and the outer-end limiting stop block is provided with at least one avoidance platform for avoidance during rotation.

By using the avoidance platform, the outer-end limiting stop block is prevented from contacting the positioning and connection base to form an obstruction, thereby ensuring that the rotary mounting cylinder has a larger opening angle.

In an embodiment, an axial ejection rod protrudes from the center of the outer end of the ejection sliding block, and the tail end of the axial ejection rod is provided with a spherical surface.

The axial ejection rod can apply an acting force to the center of the ejection sliding block, such that the ejection sliding block moves more smoothly.

In an embodiment, circumferential positioning pins protrude from the inner side of the ejection sliding block, and the circumferential positioning pins are used for being fitted with and inserted into connecting holes at an end of the fan.

The circumferential positioning pins are used to be inserted into existing connecting holes on the fan to position the fan in the circumferential direction.

In an embodiment, a main body of the ejection sliding block is in a hollow grid shape, translation guide blocks protrude from the outer periphery of the ejection sliding block, and the connecting end of the rotary mounting cylinder is provided with guide notches fitting the translation guide blocks.

Four translation guide blocks and four guide notches are respectively evenly provided, and the translation guide blocks and the guide notches are evenly distributed along the circumferential direction, thereby achieving a good displacement guide effect.

In an embodiment, the rotary mounting cylinder includes an upper housing and a lower housing assembled with each other in a snap-fit manner.

Thus, the rotary mounting cylinder can be assembled with the ejection sliding block.

In an embodiment, the upper housing and the lower housing have the same structure, and the upper housing and the lower housing are respectively provided with connection snaps and connection slots which can cooperate with each other to achieve connection;

the upper housing and the lower housing are each provided with the blocking and locking snap connecting handle fitting with the blocking and locking snap, and first rotating shaft cylinders for insertion of the rotating shaft; and the upper surface of the positioning and connection base is provided with a second rotating shaft cylinder.

The upper housing and the lower housing are made by using the same mold, and have the same structure, and can share a set of molds, thereby reducing mold opening costs.

The present disclosure further provides a server, including the fan module mounting device according to any one as described above.

The present disclosure provides a fan module mounting device, wherein the positioning and connection base is fixed inside the case for positioning and mounting the whole device; the rotary mounting cylinder has a connecting end and a pick-and-place end, the connecting end is connected to the positioning and connection base, and the pick-and-place end is used for picking and-placing; a bottom surface of the connecting end is hinged to the positioning and connection base, and the rotary mounting cylinder can pivot around the rotating shaft parallel to the positioning and connection base; two pivoting extreme positions of the rotary mounting cylinder respectively correspond to a working state and a maintenance state; wherein in the working state, the rotary mounting cylinder contacts the positioning and connection base, and in the maintenance state, the rotary mounting cylinder is away from the positioning and connection base; and the pick-and-place end of the rotary mounting cylinder is provided with a passage for a fan to enter and exit, and the fan is placed or picked from this passage; the positioning and connection base is provided with a blocking and locking snap, the blocking and locking snap can limit and be snap-fitted with the pick-and-place end of the rotary mounting cylinder, such that the rotary mounting cylinder is maintained in the working state; and in the working state, the blocking and locking snap blocks and limits the fan, thereby limiting the fan and ensuring that the fan cannot move out from the rotary mounting cylinder, and ensuring the position of the fan in the working state. During dismounting, it is only necessary to release the limiting of the blocking and locking snap on the rotary mounting cylinder, the rotary mounting cylinder is rotated and lifted upward, and the fan is picked from the rotary mounting cylinder, and thus the present disclosure can quickly and efficiently dismount and mount the fan with respect to the related art.

BRIEF DESCRIPTION OF THE DRAWINGS

In order to describe the technical solutions in the embodiments of the present disclosure or in the related art more clearly, hereinafter, accompanying drawings requiring to be used for describing the embodiments or the related art are introduced briefly. Apparently, the accompanying drawings in the following description merely relate to some embodiments of the present disclosure, and for a person of ordinary skill in the art, other accompanying drawings can also be obtained according to these accompanying drawings without involving any inventive effort.

The drawings include.

Figure 1:
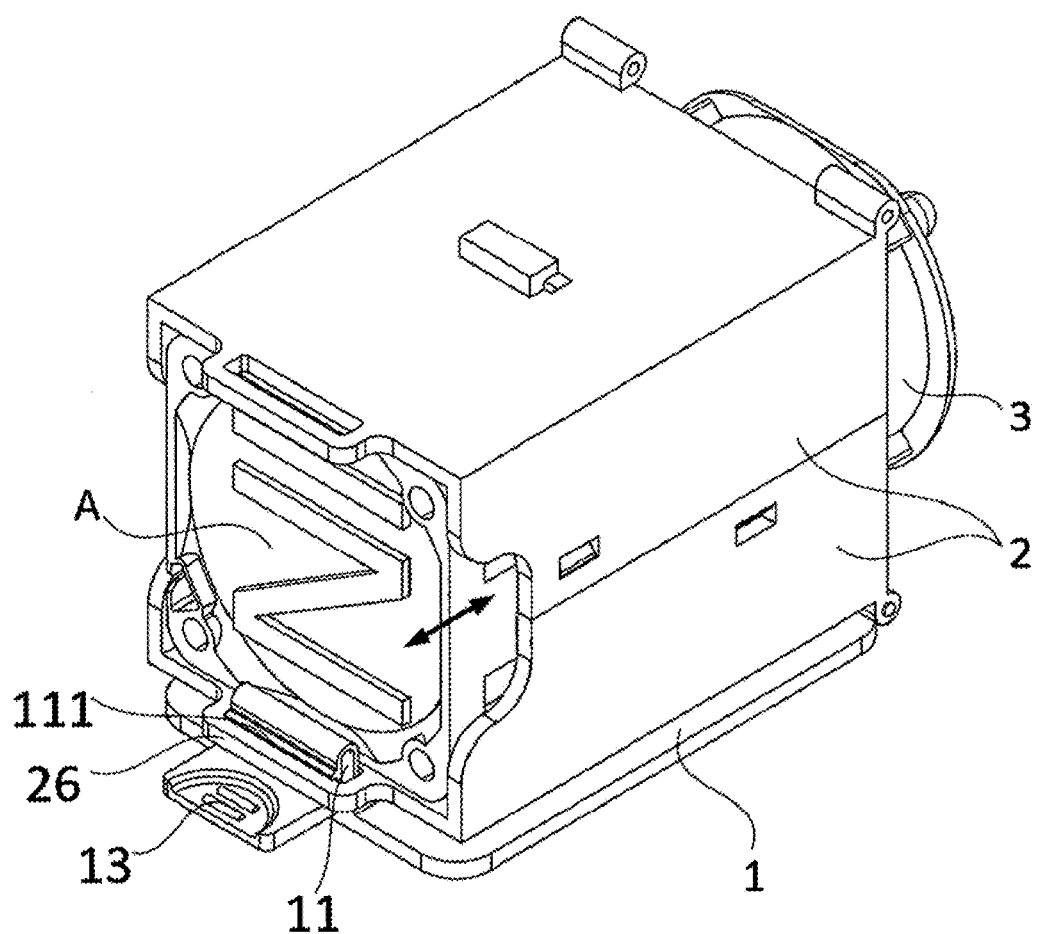
FIG. 1 is an overall structural axonometrical drawing of a fan module mounting device in a working state at a specific embodiment provided according to the present disclosure.

Positioning and connection base 1, blocking and locking snap 11, snap-fit flange 111, 12, unlocking block 13, first spring clamping block 14, second rotating shaft cylinder 15, rotary mounting cylinder 2, lifting elastic member 21, second spring clamping block 22, guide notch 23, connection snap 24, connection slot 25, blocking and locking snap connecting handle 26, first rotating shaft cylinder 27, ejection sliding block 3, axial ejection rod 31, circumferential positioning pin 32, translation guide block 33, inner-end limiting stop block 34, outer-end limiting stop block 35, avoidance platform 351.

DETAILED DESCRIPTION OF THE EMBODIMENTS

The core of the present disclosure is to provide a fan module mounting device, which can conveniently and quickly complete the mounting and dismounting of a fan, thereby increasing the operation efficiency.

In order to enable a person skilled in the art to better understand the technical solutions of the present disclosure, a fan module mounting device and a server in the present disclosure will be described in detail with reference to the accompanying drawings and specific embodiments.

Figure 2:
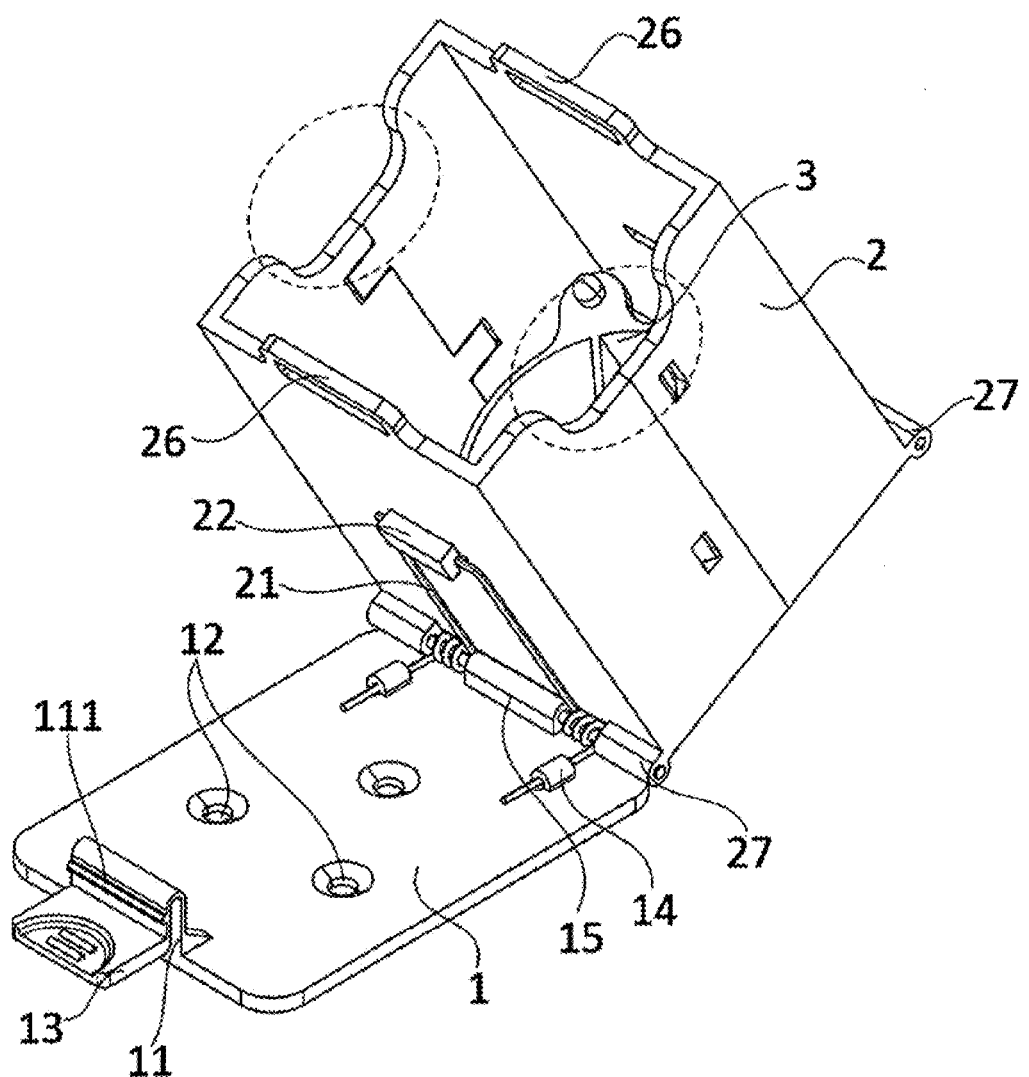
FIG. 2 is an overall structural axonometrical drawing of a fan module mounting device in a maintenance state at a specific embodiment provided according to the present disclosure.

As shown in FIGS. 1 and 2, FIG. 1 is an overall structural axonometrical drawing of a specific embodiment of a fan module mounting device according to the present disclosure, in which FIG. 1 shows a working state, A in FIG. 1 denotes a fan, and the fan can move along a direction indicated by a bidirectional arrow in FIG. 1; and FIG. 2 is an axonometrical drawing of a fan module mounting device in a maintenance state according to the present disclosure. The fan module mounting device provided in the present disclosure includes structures such as a positioning and connection base 1 and a rotary mounting cylinder 2, wherein the positioning and connection base 1 is fixed inside a case, and the whole fan module mounting device is mounted inside the case.

The rotary mounting cylinder 2 has a connecting end and a pick-and-place end along the length direction thereof, and in FIG. 1, the right end is the connecting end, and the left end is the pick-and-place end. The bottom surface of the connecting end of the rotary mounting cylinder 2 is hinged to the positioning and connection base 1, the rotary mounting cylinder 2 can pivot around a rotating shaft parallel to the positioning and connection base 1, and two pivoting extreme positions of the rotary mounting cylinder 2 respectively correspond to the working state and the maintenance state. When the rotary mounting cylinder 2 is in the working state, the rotary mounting cylinder 2 and the positioning and connection base 1 are close to each other (the state as shown in FIG. 1); and when the rotary mounting cylinder 2 is in the maintenance state, the rotary mounting cylinder 2 and the positioning and connection base 1 are away from each other (the state as shown in FIG. 2). In the working state, the fan maintains electrical connection, and can perform normal cooling and heat dissipation; and in the maintenance state, the fan can be picked from the rotary mounting cylinder 2. Generally, during mounting, the fan needs to be mounted in place first and then electrically connected; and during removal, the electrical connection of the fan needs to be solved first and then the fan is picked.

The pick-and-place end and the connecting end are arranged opposite each other, the rotating shaft is arranged at the connecting end, the pick-and-place end is away from the rotating shaft, and the pick-and-place end of the rotary mounting cylinder 2 away from the rotating shaft is provided with a passage for the fan to enter and exit. The positioning and connection base 1 is provided with a blocking and locking snap 11, and the blocking and locking snap 11 is used for snap-fitting with and limiting the pick-and-place end of the rotary mounting cylinder 2 and forming limiting and blocking for the fan. In the working state, the rotary mounting cylinder 2 is close to the positioning and connection base 1, and at this time, the blocking and locking snap 11 is snap-fitted with and limits the pick-and-place end of the rotary mounting cylinder 2, and at this time, the blocking and locking snap 11 blocks and limits the fan, such that the fan cannot move out of the rotary mounting cylinder 2 due to the blocking by the blocking and locking snap 11, and the axial position of the fan is limited. The periphery of the fan is limited and blocked by the side wall of the rotary mounting cylinder 2, one end of the fan is blocked by the bottom surface of the rotary mounting cylinder 2, and the other end of the fan is blocked by the blocking and locking snap 11. In the working state, the positions of the fan in various directions are completely limited, and the fan cannot be separated from the rotary mounting cylinder 2.

Figure 3:
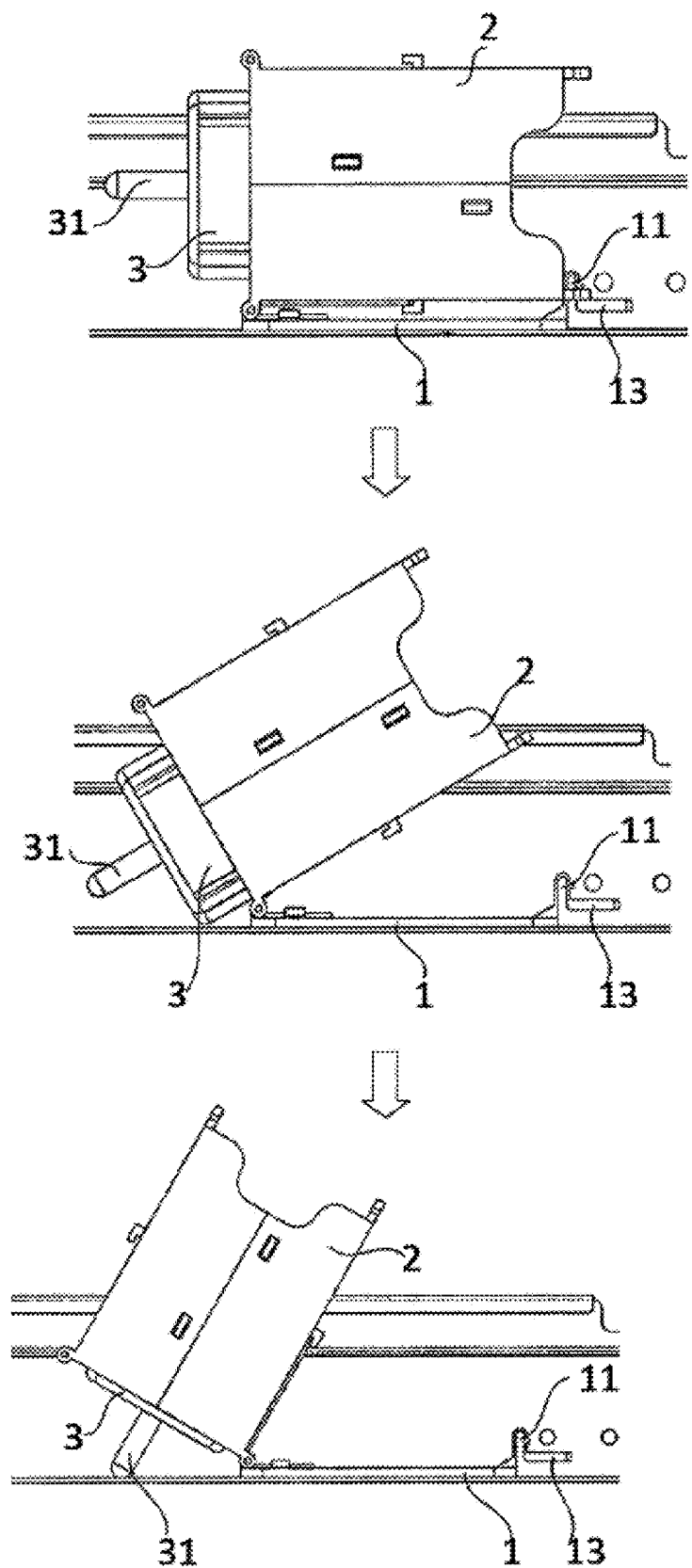
FIG. 3 is a schematic diagram of a dismounting process of a fan module mounting device at a specific embodiment provided according to the present disclosure.

In the fan module mounting device provided in the present disclosure, the fan adopts an insertion assembly manner, and the fan can only move linearly relative to the rotary mounting cylinder 2. When the fan moves to be in place, the rotary mounting cylinder 2 drives the fan to synchronously rotate to approach the positioning and connection base 1, and the rotary mounting cylinder 2 is snap-fitted with and limited by the blocking and locking snap 11; and at the same time, the fan is limited and blocked by the blocking and locking snap 11, and thus the fan and the rotary mounting cylinder 2 are both fixed relative to the position of the positioning and connection base 1. With reference to FIG. 3, a dismounting process of the fan is introduced, which relates to schematic diagrams of three different positions of the working state, a rotating state and the maintenance state, from top to bottom. When the fan is to be removed, the blocking and locking snap 11 is first pressed, such that the blocking and locking snap 11 is elastically deformed, and the blocking and locking snap 11 releases the limiting on the rotary mounting cylinder 2; in this case, the pick-and-place end of the rotary mounting cylinder 2 is lifted upwards, the rotary mounting cylinder 2 rotates around the rotating shaft, and the pick-and-place end is lifted upwards gradually; and when lifting upwards to an extreme position, the pick-and-place end of the rotary mounting cylinder 2 faces obliquely upward, and at this time, the fan can be picked from the pick-and-place end.

In the process of snap-fitting and releasing, it is only necessary to lock or unlock the blocking and locking snap 11, and in cooperation with the rotation of the rotary mounting cylinder 2, the mounting and dismounting of the fan can be realized. Compared with the traditional fixing manners such as fixing by multiple screws, the operation process can be greatly simplified, and quick and convenient dismounting and mounting of the fan can be achieved. During mounting, the fan is first placed into the rotary mounting cylinder 2, and then the fan is driven by the rotary mounting cylinder 2 to rotate downwards, the fan gradually approaches the positioning and connection base 1 and is finally locked by the blocking and locking snap 11, and the blocking and locking snap 11 is elastically deformed during locking, and snap-fitted with an end edge of the rotary mounting cylinder 2. During dismounting, the rotary mounting cylinder 2 can be lifted upwards by only unlocking the limiting of the blocking and locking snap 11, and after lifting, the fan can be drawn out and dismounted.

Based on the described solutions, in the present disclosure, one rotary mounting cylinder 2 is assembled correspondingly to one positioning and connection base 1, the positioning and connection base 1 corresponds to the rotary mounting cylinder 2 on one-to-one basis, and each fan module mounting device is an independent structure, is not mixed with other devices, and has high standardization. Of course, the present disclosure does not exclude other arrangement solutions, for example, a plurality of rotary mounting cylinders 2 share the same one positioning and connection base 1; and in this situation, only one positioning and connection base 1 needs to be fixed inside the case, and the positioning and connection base does not need to be repeatedly fixed for multiple times, which can further increase the operation efficiency, and therefore this situation also falls within the scope of protection of the present disclosure. In addition, a plurality of rotary mounting cylinders 2 may also be fixed integrally, and can lift a row of fans at one time; and correspondingly, the plurality of rotary mounting cylinders 2 fixed integrally correspond to the same one positioning and connection base 1. All these specific embodiments can achieve the technical effects to be achieved by the present disclosure, and all fall within the scope of protection of the present disclosure.

Figure 6:
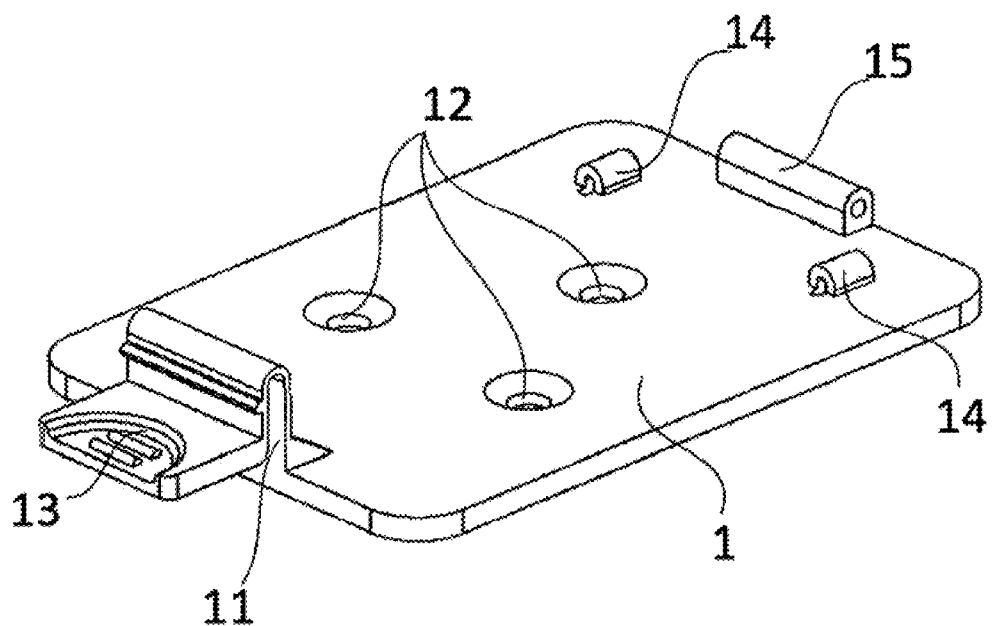
FIG. 6 is a schematic structural diagram of a positioning and connection base.

In some embodiments, the positioning and connection base 1 is a flat plate; and in the structure shown in FIGS. 2 and 6, the positioning and connection base 1 is a rectangular flat plate structure, the flat plate structure occupies a small space and can be attached to a main board by means of the flat plate. The positioning and connection base 1 is provided with fixing and connecting holes 12 for assembling blind rivets, the fixing and connecting holes 12 are through holes passing through the positioning and connection base 1, and the passing directions of the fixing and connecting holes 12 are perpendicular to the flat plate surface of the positioning and connection base 1. As shown in FIGS. 2 and 6, three through holes are provided on the plate surface of the positioning and connection base 1, each through hole can be correspondingly mounted with one blind rivet, and the positioning and connection base 1 is fixedly connected to positions such as the main board, etc. inside the case by means of the three blind rivets, etc. The matching between the fixing and connecting holes 12 and the blind rivets is only an optional manner, and fixing and connecting manners such as screws may also be used; and all these specific embodiments shall be included in the scope of protection of the present disclosure. In order to achieve a stable connection effect, the positioning and connection base 1 generally needs to be provided with three connection positions, and it should be noted here that in the structures shown in FIGS. 2 and 6, three independent fixing and connecting holes 12 are provided; however, independent through holes are not necessary, and if necessary, through holes in communication with each other can be provided, and such embodiments also fall within the scope of protection of the present disclosure.

As shown in FIGS. 2 and 6, a chamfer is provided at the upper edge of each fixing and connecting hole 12, and the chamfer is used to provide avoidance for a mounted blind rivet or screw, such that the blind rivet or screw is completely trapped in the connecting hole 12, and the blind rivet or screw is kept at the same height as the upper surface of the positioning and connection base 1.

With reference to FIGS. 2 and 6, in an embodiment of the present disclosure, the blocking and locking snap 11 protrudes upwards and is provided on an edge of the upper surface of the positioning and connection base 1; and a snap-fit flange 111 is provided in a direction of the blocking and locking snap 11 facing away from the positioning and connection base 1, and the snap-fit flange 111 is a protruding block structure protruding from the surface of the blocking and locking snap 11. As shown in FIGS. 1 and 2, the snap-fit flange 111 is an elongated flat protruding block, and the specific structure of the snap-fit flange 111 can be adjusted as required, and is not compulsorily required in the present disclosure.

Correspondingly, a blocking and locking snap connecting handle 26 is provided at the edge of the pick-and-place end of the rotary mounting cylinder 2, the blocking and locking snap connecting handle 26 is close to the positioning and connection base 1, and the snap-fit flange 111 cooperates with the blocking and locking snap connecting handle 26 for limiting and locking. The blocking and locking snap connecting handle 26 is a U-shaped semi-annular structure, the blocking and locking snap connecting handle 26 protrudes from the edge of the rotary mounting cylinder 2, the blocking and locking snap connecting handle 26 and the rotary mounting cylinder 2 form an elongated annular structure, and the blocking and locking snap 11 can extend into the annular structure.

The blocking and locking snap 11 is generally of a vertically upward protruding plate-like structure, and the snap-fit flange 111 protrudes from a side surface of the plate-like structure; the vertical plate-like portion of the blocking and locking snap 11 can be elastically deformed, and the snap-fit flange 111 is used for snap-fitting with the rotary mounting cylinder 2. As shown in FIGS. 1 and 2, the snap-fit flange 111 protrudes towards the side facing away from the rotary mounting cylinder 2 and is used for cooperating with the blocking and locking snap connecting handle 26, and the snap-fit flange 111 is pressed against the upper surface of the blocking and locking snap connecting handle 26 without an external force, thereby forming blocking against the rotary mounting cylinder 2, and preventing the rotary mounting cylinder from rotating upwards. During unlocking, the upper end of the blocking and locking snap 11 is elastically deformed in the direction towards the rotary mounting cylinder 2, the snap-fit flange 111 is separated from the blocking and locking snap connecting handle 26, such that the locking of the blocking and locking snap connecting handle 26 is released, and the rotary mounting cylinder 2 can rotate upwards.

In an embodiment of the present disclosure, the blocking and locking snap 11 needs to extend into the annular structure formed by the blocking and locking snap connecting handle 26. In order to facilitate accurate insertion and prevent from being blocked, in the present disclosure, the upper edge of the blocking and locking snap 11 is set as a cylindrical surface or a wedge-shaped structure, i.e. the blocking and locking snap is tapered from bottom to top in the thickness direction; and in the width direction, a structure tapered from bottom to top may also be provided, which facilitates positioning and alignment in the process of insertion and alignment. In this structure, the snap-fit flange 111 is provided at a position where the blocking and locking snap 11 is close to the upper edge, but the snap-fit flange 111 is not located at the upper edge of the blocking and locking snap 11, but remained in the tapered guiding structure on the upper portion of the blocking and locking snap 11.

In an embodiment of the present disclosure, the snap-fit flange 111 is arranged in the direction of the blocking and locking snap 11 facing away from the positioning and connection base 1; however, the present disclosure is not limited to this one form, and the snap-fit flange 111 may also protrude towards the side where the rotary mounting cylinder 2 is located (facing away from the described arrangement position), and the snap-fit flange 111 can directly match the edge of the side wall of the rotary mounting cylinder 2 to achieve snap-fit, which can achieve the same locking effect. When unlocking is required, the upper end of the blocking and locking snap 11 is elastically deformed towards the direction away from the rotary mounting cylinder 2, and the snap-fit flange 111 and the rotary mounting cylinder 2 are separated from each other, such that locking of the rotary mounting cylinder 2 is released, and the rotary mounting cylinder 2 can rotate upwards. All these specific embodiments above should be included in the scope of protection of the present disclosure.

It should be noted that the upper edge of the blocking and locking snap 11 is a smooth curved surface, the width of the upper edge gradually decreases from bottom to top, and the upper edge shown in FIG. 2 forms a cylindrical surface; and such a structure avoids the formation of abrupt edges and corners, thereby avoiding clamping stagnation during snap-fitting and improving the operation experience.

With reference to FIGS. 1, 2 and 6, in the present disclosure, an unlocking block 13 is provided in the direction of the blocking and locking snap 11 facing away from the positioning and connection base 1, the unlocking block 13 extends along a transverse direction; one end of the unlocking block 13 remains fixed, and the other end thereof is suspended, and the unlocking block is of a cantilever structure; and the unlocking block 13 is generally a flat plate-shaped structure, and the unlocking block 13 can drive the blocking and locking snap 11 to be elastically deformed, thereby facilitating the application of an acting force in a releasing process.

With reference to FIGS. 3 and 6, in the present disclosure, the vertical height where the unlocking block 13 is located is higher than that of the upper surface of the positioning and connection base 1, and the lower surface of the unlocking block 13 is higher than the upper surface of the positioning and connection base 1. There is a spacing between the unlocking block 13 and the positioning and connection base 1, which can allow for application of an acting force to the blocking and locking snap 11 more effectively, and facilitate elastic deformation of the blocking and locking snap 11. During unlocking, the unlocking block 13 is lifted upwards, the unlocking block 13 then drives the blocking and locking snap 11 to be elastically deformed, and the snap-fit flange 111 on the blocking and locking snap 11 moves towards the side where the rotary mounting cylinder 2 is located, such that the snap-fit flange 111 releases the locked state of the rotary mounting cylinder 2, and the rotary mounting cylinder 2 can be lifted upwards. If the snap-fit flange 111 is arranged towards the rotary mounting cylinder 2, during unlocking, it is necessary to apply a downward pressure to the unlocking block 13, such that the snap-fit flange 111 moves towards the side away from the rotary mounting cylinder 2.

In order to more conveniently operate the unlocking block 13, corresponding protruding block and recess can be provided on the unlocking block 13, such that on one hand, the friction force can be increased to avoid slipping during operation, and on the other hand, a corresponding positioning effect can be formed on the pressing position of a finger, thereby facilitating rapid and accurate recognition of the pressing position. Generally, applying an acting force to the edge of the tail end of the unlocking block 13 can enable the blocking and locking snap 11 to generate a greater deformation degree, and thus applying a small acting force can complete deformation and unlocking of the blocking and locking snap 11.

In an embodiment of the present disclosure, a lifting elastic member 21 is provided between the rotary mounting cylinder 2 and the positioning and connection base 1, and the lifting elastic member 21 provides an upward elastic force to the rotary mounting cylinder 2. The best state is that the elastic force of the lifting elastic member 21 is greater than the gravity of the rotary mounting cylinder 2 itself. When the rotary mounting cylinder 2 is unlocked, the rotary mounting cylinder 2 tends to lift upwards under the action of the elastic force of the lifting elastic member 21; and as soon as the blocking and locking snap 11 is unlocked, the rotary mounting cylinder 2 can be lifted upward automatically without manually lifting the rotary mounting cylinder 2, which can further optimize the operation experience. When the fan is mounted, the fan is placed in the rotary mounting cylinder 2 and the rotary mounting cylinder 2 is pressed downwards, and the rotary mounting cylinder 2 rotates downwards to overcome the elastic force of the lifting elastic member 21 until the rotary mounting cylinder 2 and the blocking and locking snap 11 cooperate with each other and are snap-fitted, and at this time, the lifting elastic member 21 is maintained in the maximum compression state.

Figure 9:
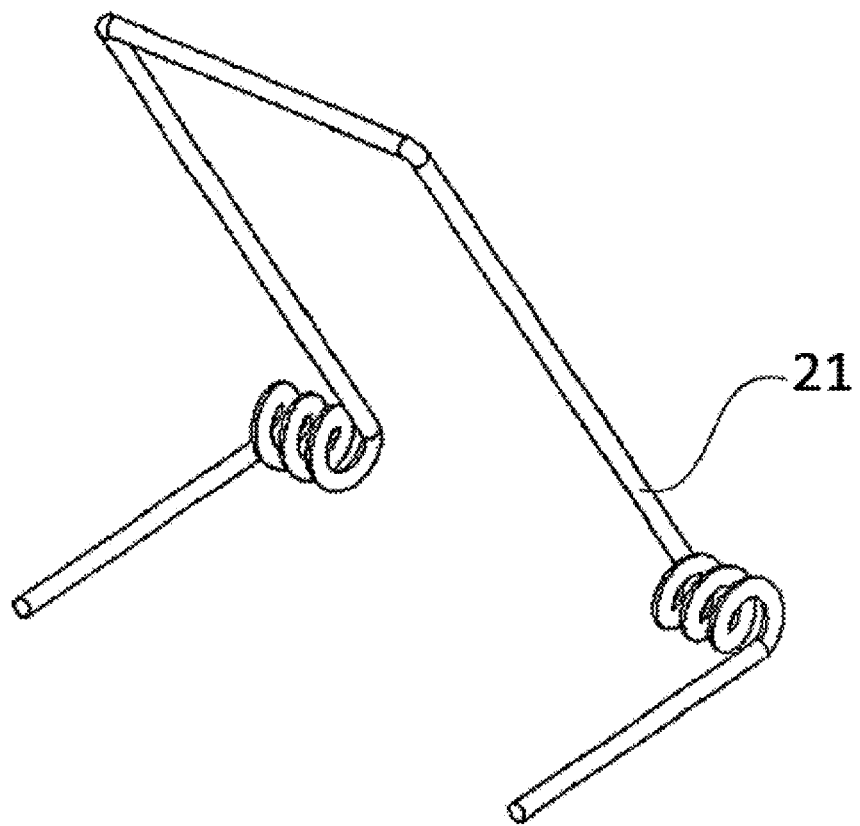
FIG. 9 is a schematic structural diagram of a lifting elastic member.

With reference to FIGS. 2 and 9, in the present disclosure, the lifting elastic member 21 used is a torsion spring, and the torsion spring can form a coaxial torque with the rotating shaft of the rotary mounting cylinder 2 and does not occupy too much space, thereby increasing the space utilization. The torsion spring shown in FIG. 9 includes two spiral sections, wherein the two spiral sections are sleeved outside the rotating shaft, a section of "⊓"-shaped structure is formed between the two spiral sections, and each of the two spiral sections extends to form a section of "⌐"-shaped structure for limiting the torsion spring, such that the torsion spring is torsionally compressed.

In an embodiment of the present disclosure, the drawings show one lifting elastic member 21 having two spiral sections, thereby forming a stable torsional force. In addition to using one torsion spring as a whole, a split-type structure may also be used, that is, two or more torsion springs may be used, each torsion spring having one spiral section, and such a structure can achieve the same technical effect. The present disclosure adopt the structure of one torsion spring, which can effectively simplify the assembly process and improve the assembly convenience.

With reference to FIGS. 2 and 6, in the present disclosure, first spring clamping blocks 14 for clamping the lifting elastic member 21 are arranged on the positioning and connection base 1, and a second spring clamping block 22 for clamping the lifting elastic member 21 is arranged on the bottom surface of the rotary mounting cylinder 2. The first spring clamping blocks 14 arranged on the positioning and connection base 1 are used for clamping the "—"-shaped structure formed on the torsion spring, and the second spring clamping block 22 is used for clamping the "Π"-shaped structure formed on the torsion spring, such that the lifting elastic member 21 is maintained at a stable position.

As shown in FIG. 2, the positions selected by the two dotted elliptical frames represent notches, and the side wall of the pick-and-place end of the rotary mounting cylinder 2 is provided with notches for avoiding fingers. Since the length of the entire rotary mounting cylinder 2 is substantially equal to the length of the fan, acting points are small when the fan is picked, it is difficult for fingers to grip the acting points, and thus notches are provided on two opposite side walls of the rotary mounting cylinder 2, such that it is convenient for fingers to directly hold the fan, thereby facilitating picking of the fan. The shape and specific size of the notches are set according to specific requirements, and will not be specifically limited in the present disclosure.

Figure 4:
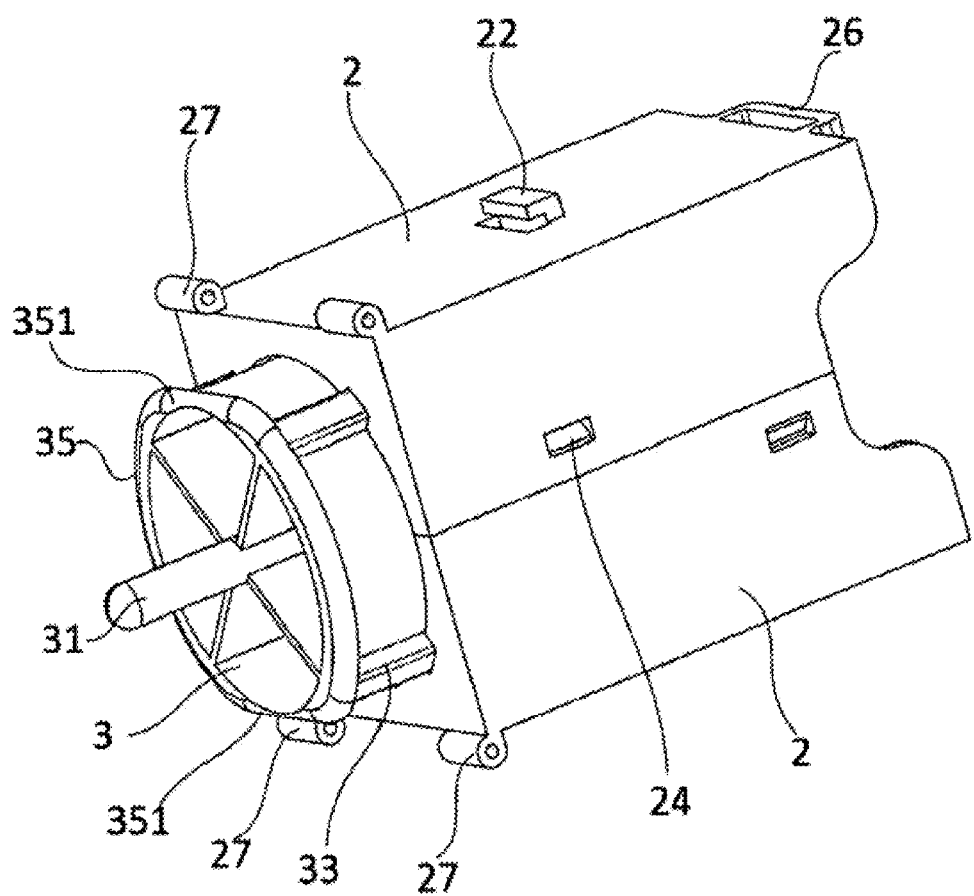
FIG. 4 is a schematic diagram of an overall structure of a rotary mounting cylinder and an ejection sliding block cooperating with each other.
Figure 5:
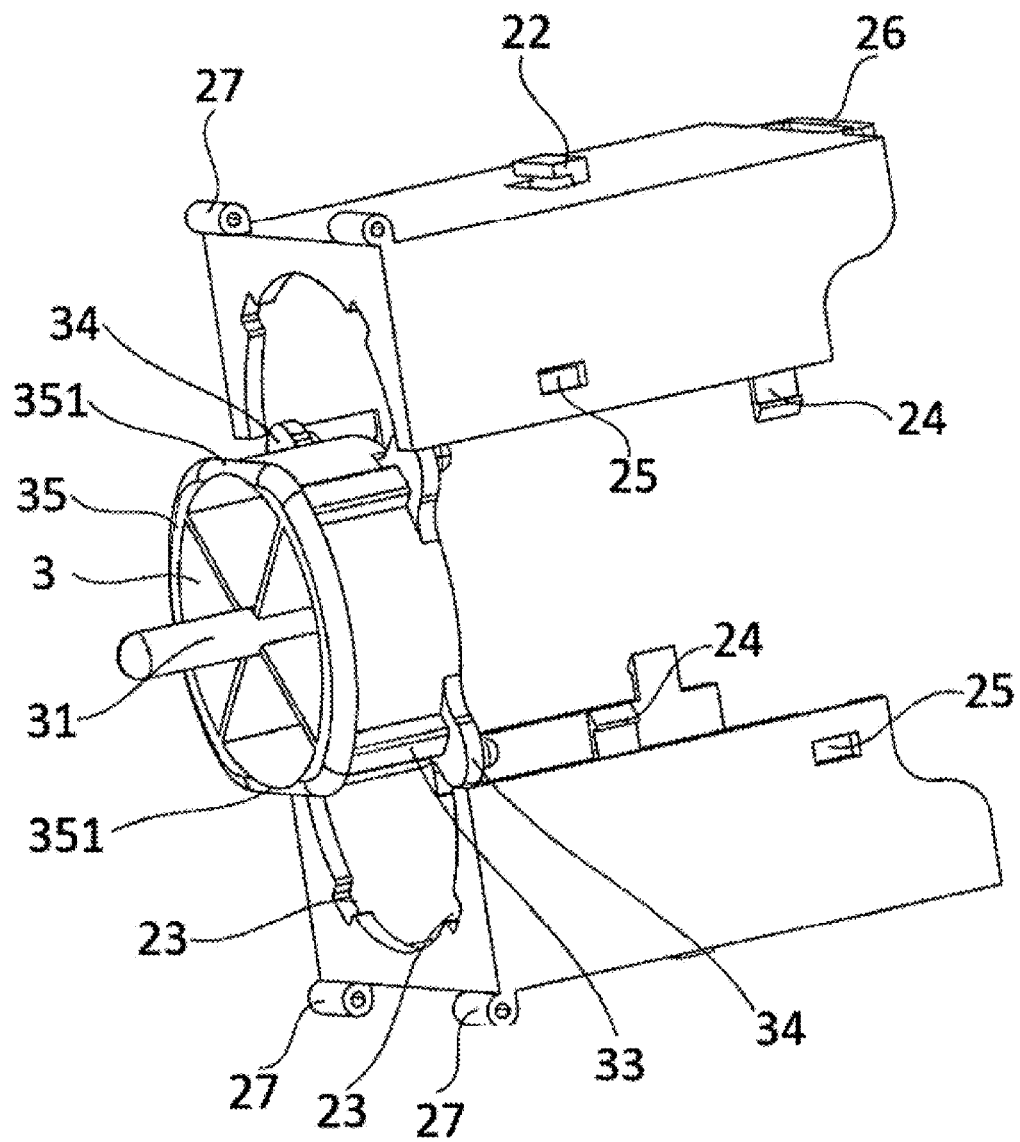
FIG. 5 is an exploded view of a rotary mounting cylinder and an ejection sliding block cooperating with each other.

Based on any one of the described technical solutions and combinations thereof, the present disclosure provides further preferable solutions herein. As shown in FIGS. 3, 4 and 5, in the present disclosure, the connecting end of the rotary mounting cylinder 2 is slidably provided with an ejection sliding block 3, that is, the connecting end of the rotary mounting cylinder 2 is not a closed wall surface, but the connecting end of the rotary mounting cylinder 2 is provided with the ejection sliding block 3. The ejection sliding block 3 is an independent structure, and the ejection sliding block 3 is divided into an inner end and an outer end along the axial direction, the inner end extends into the interior of the rotary mounting cylinder 2, and the outer end extends out of the rotary mounting cylinder 2. The inner end of the ejection sliding block 3 is in contact with the fan, and the outer end is in contact with the interior of the case and is retracted in the maintenance state, such that the fan can be ejected out.

As shown in FIG. 5, several inner-end limiting stop blocks 34 are provided at the inner end of the ejection sliding block 3, and the inner-end limiting stop blocks 34 are of a block structure, the outer periphery size of the inner-end limiting stop blocks 34 is larger than that of an opening provided at the connecting end of the rotary mounting cylinder 2. The inner-end limiting stop blocks 34 can contact the inner wall of the connecting end of the rotary mounting cylinder 2, and the ejection sliding block 3 is blocked by the inner-end limiting stop blocks 34. Therefore, the ejection sliding block 3 cannot be completely pulled out from the rotary mounting cylinder 2, and when the inner-end limiting stop blocks 34 contact the inner wall of the connecting end of the rotary mounting cylinder 2, the ejection sliding block 3 is in a maximal outwardly-extending state.

An outer-end limiting stop block 35 is provided at the outer end of the ejection sliding block 3, the outer periphery size of the outer-end limiting stop block 35 is greater than the size of the opening provided at the connecting end of the rotary mounting cylinder 2, and the maximum size of the ejection sliding block 3 extending into the rotary mounting cylinder 2 can be defined, thereby preventing the ejection sliding block 3 from completely entering the rotary mounting cylinder 2. When the outer-end limiting stop block 35 contacts the outer wall of the connecting end of the rotary mounting cylinder 2, the ejection sliding block 3 is in a maximal inwardly-extending state.

Figure 8:
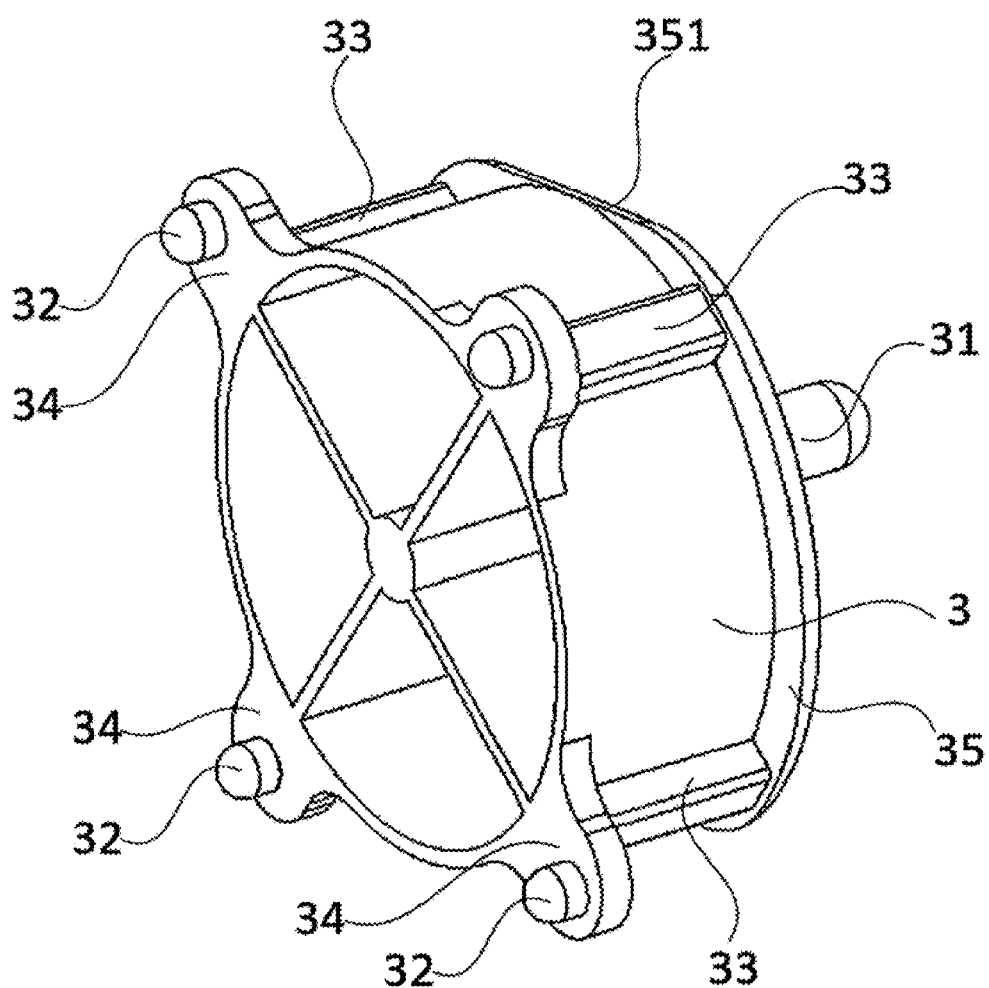
FIG. 8 is a schematic structural diagram of an ejection sliding block.

With reference to FIGS. 5 and 8, in the present disclosure, the outer-end limiting stop block 35 is a complete annular structure, the inner-end limiting stop blocks 34 are several split-type independent structures, and the functions of the outer-end limiting stop block 35 and the inner-end limiting stop blocks 34 are both axial limiting. Therefore, the structure shown in the figures is only a preferred structure, and both the outer-end limiting stop block 35 and the inner-end limiting stop blocks 34 can be provided with specific structures according to needs. The outer-end limiting stop block 35 may be integrally or separately provided, and the inner-end limiting stop blocks 34 may be integrally or separately provided; and all these specific embodiments shall be included in the scope of protection of the present disclosure.

In an embodiment of the present disclosure, the provided outer-end limiting stop block 35 is annular, and the outer-end limiting stop block 35 is provided with at least one avoidance platform 351 for avoidance during rotation. As shown in FIGS. 4, 5 and 8, the outer-end limiting stop block 35 is provided with two avoidance platforms 351, and the avoidance platforms 351 are equivalent to cut one piece off from the outer-end limiting stop block 35, such that the avoidance platforms 351 are flush with the cylindrical side surface of the outer-end limiting stop block 35. An avoidance platform 351 is close to the positioning and connection base 1, the avoidance platforms 351 are parallel to the surface of the positioning and connection base 1. When the rotary mounting cylinder 2 rotates to be opened, the avoidance platforms 351 do not contact with the positioning and connection base 1, thereby forming an avoidance effect, increasing the rotation opening angle of the rotary mounting cylinder 2, such that the rotary mounting cylinder 2 can rotate by a larger angle, thereby facilitating picking and placing of the fan.

As shown in FIG. 3, when the rotary mounting cylinder 2 is lifted upward and rotated to be opened, the connecting end of the rotary mounting cylinder 2 is pivoted downwards and gradually comes close to the plane where the positioning and connection base 1 is located, and the rotary mounting cylinder 2, the interior fan and the ejection sliding block 3 move synchronously. The ejection sliding block 3 gradually comes close to the plane where the positioning and connection base 1 is located, and at a certain moment, the ejection sliding block 3 is in contact with the plane where the positioning and connection base 1 is located, e.g. contacting the main board; and at this time, the ejection sliding block 3 no longer keeps synchronous movement with the rotary mounting cylinder 2, and after the ejection sliding block 3 is blocked and is pushed towards the interior of the rotary mounting cylinder 2, the ejection sliding block 3 pushes the fan, and pushes the fan A towards the pick-and-place end. Finally, an end of the fan is pushed out of the rotary mounting cylinder 2 by the ejection sliding block 3, such that the fan can be picked conveniently.

As shown in FIGS. 4, 5 and 8, in the present disclosure, an axial ejection rod 31 protrudes from the center of the outer end of the ejection sliding block 3, the lengthwise direction of the axial ejection rod 31 and the axis of the fan are maintained to extend in the same direction, and the axial ejection rod 31 increases the overall length of the ejection sliding block 3. The tail end of the axial ejection rod 31 is provided with a spherical surface, which can avoid the problem of clamping stagnation when the axial ejection rod 31 contacts positions such as the main board, and can allow for more smooth pushing of the axial ejection rod 31. By providing the axial ejection rod 31, the axial ejection rod 31 can apply an acting force to the center of the ejection sliding block 3 without increasing the length of the main body part of the whole ejection sliding block 3, such that the ejection sliding block 3 moves more smoothly.

With reference to FIG. 8, in the present disclosure, circumferential positioning pins 32 protrude from the inner side of the ejection sliding block 3, and the circumferential positioning pins 32 are used for being fitted with and inserted into connecting holes at an end of the fan. In FIG. 8, the circumferential positioning pins 32 are arranged on the inner-end limiting stop blocks 34, and the circumferential positioning pins 32 are used to be inserted into existing connecting holes on the fan to position the fan in the circumferential direction. The tail end of each circumferential positioning pin 32 is a spherical surface or a conical surface, which can achieve a better guiding and inserting effect.

With reference to FIG. 8, in the present disclosure, the main body of the ejection sliding block 3 is in a hollow grid shape, the main body of the ejection sliding block 3 is a cylindrical housing, and criss-cross partition plates are provided in the inner cavity thereof, which can increase the structural strength of the main body of the ejection sliding block 3 on one hand, and achieve a more stable support effect for the axial ejection rod 31 via the criss-cross partition plates on the other hand.

Translation guide blocks 33 protrude from the outer periphery of the ejection sliding block 3, and the lengthwise direction of the translation guide blocks 33 is along the axial direction, and the translation guide blocks 33 protrude radially from the outer peripheral surface of the ejection sliding block 3; and guide notches 23 fitting the translation guide blocks 33 are provided on the wall surface of the connecting end of the rotary mounting cylinder 2, the translation guide blocks 33 can be exactly snapped into the guide notches 23, and the translation guide blocks 33 and the guide notches 23 form guide fit with each other, which makes the axial displacement of the ejection sliding block 3 smoother. The translation guide blocks 33 and the guide notches 23 are in one-to-one correspondence, and the number of the two are set according to requirements. In the structure as shown in FIG. 5, four translation guide blocks 33 and four guide notches 23 are respectively provided, and the translation guide blocks 33 and the guide notches 23 are evenly distributed along the circumferential direction, thereby achieving a good displacement guide effect.

In an embodiment of the present disclosure, the rotary mounting cylinder 2 in includes an upper housing and a lower housing assembled with each other in a snap-fit manner, that is, the rotary mounting cylinder 2 is formed by assembling two upper and lower split structures. The function of forming the rotary mounting cylinder by assembling split structures is to form limiting fit effect with the ejection sliding block 3, and the outer-end limiting stop block 35 and the inner-end limiting stop blocks 34 can respectively form limiting fit with the wall surface of the connecting end of the rotary mounting cylinder 2.

In an embodiment of the present disclosure, the upper housing and the lower housing provided have the same structure, that is, the upper housing and the lower housing are made by using the same mold, and have the same structure, and can share a set of molds, thereby reducing mold opening costs.

The upper housing and the lower housing are respectively provided with connection snaps 24 and connection slot 25 which can cooperate with each other to achieve connection, and the upper housing and the lower housing are respectively U-shaped housings. Each housing has two side walls parallel to each other, and each side wall is provided with a connection snap 24 and a connection slot 25, the connection snap 24 protrudes from the edge of the side wall, and the connection slot 25 is a through hole provided on the side wall; and the connection snaps 24 provided on the upper housing and the connection slots 25 provided on the lower housing can be mutually snap-fitted and assembled, and the connection slots 25 provided on the upper housing and the connection snaps 24 provided on the lower housing can be mutually snap-fitted and assembled. The upper housing and the lower housing are fixedly connected to each other by assembling and snap-fitting of at least two groups of connection snaps 24 and connection slots 25 arranged on the two side walls.

The cross section of the connection snap 24 is L-shaped. During assembly, the connection snaps 24 of the upper housing are in contact with and attached to the inner surface of the side wall of the lower housing, and the connection snaps 24 of the lower housing are in contact with and attached to the inner surface of the side wall of the upper housing. The upper housing and the lower housing fit with each other and are connected together as a whole.

As shown in FIGS. 4 and 5, two avoidance platforms 351 are provided, the two avoidance platforms are symmetrically arranged, the positioning and connection base 1 can be mounted at any one of the upper part and the lower part of the rotary mounting cylinder 2, and the situation in which the positioning and connection base 1 is mounted at the lower part is taken as an example for illustration: the avoidance platform 351 at the lower part is close to the positioning and connection base 1 so as to achieve the effect of avoidance during use; and the avoidance platform 351 at the upper part is away from the positioning and connection base 1, and does not achieve the effect of avoidance during use. Since the two avoidance platforms 351 are symmetrically arranged, no matter at which position the positioning and connection base 1 is mounted on the rotary mounting cylinder 2, an avoidance effect can be formed; the mounting angle of the ejection sliding block 3 does not need to be strictly limited, and the ejection sliding block 3 being mounted forwardly and mounted reversely can both satisfy the same function implementation, thereby having a higher mounting flexibility.

Guide assembling is achieved between the ejection sliding block 3 and the rotary mounting cylinder 2 by means of the four translation guide blocks 33. On this basis, four avoidance platforms 351 can also be arranged on the ejection sliding block 3, an included angle of 90 degrees exists between adjacent avoidance platforms 351, and the four translation guide blocks 33 have an included angle of 90 degrees. In this case, as long as the ejection sliding block 3 can be assembled, the function of avoidance can be achieved by means of one of the avoidance platforms 351. All these specific embodiments shall be included in the scope of protection of the present disclosure.

The upper housing and the lower housing are each provided with the blocking and locking snap connecting handle 26 fitting with the blocking and locking snap 11, and first rotating shaft cylinders 27 for insertion of the rotating shaft; and the upper surface of the positioning and connection base 1 is provided with a second rotating shaft cylinder 15. As shown in FIGS. 2, 4 and 5, the blocking and locking snap connecting handle 26 is a U-shaped semi-enclosed structure and is fixed at the edge of the pick-and-place end of the rotary mounting cylinder 2, and the blocking and locking snap connecting handle 26 and the rotary mounting cylinder 2 form a closed annular structure having an elongated channel; the width of the channel is greater than the thickness of the blocking and locking snap 11, and the channel can be used for extending of the blocking and locking snap 11, and after the blocking and locking snap 11 extends into the channel, the snap-fit flange 111 provided on the blocking and locking snap may form snap-fit with the blocking and locking snap connecting handle 26.

Figure 7:
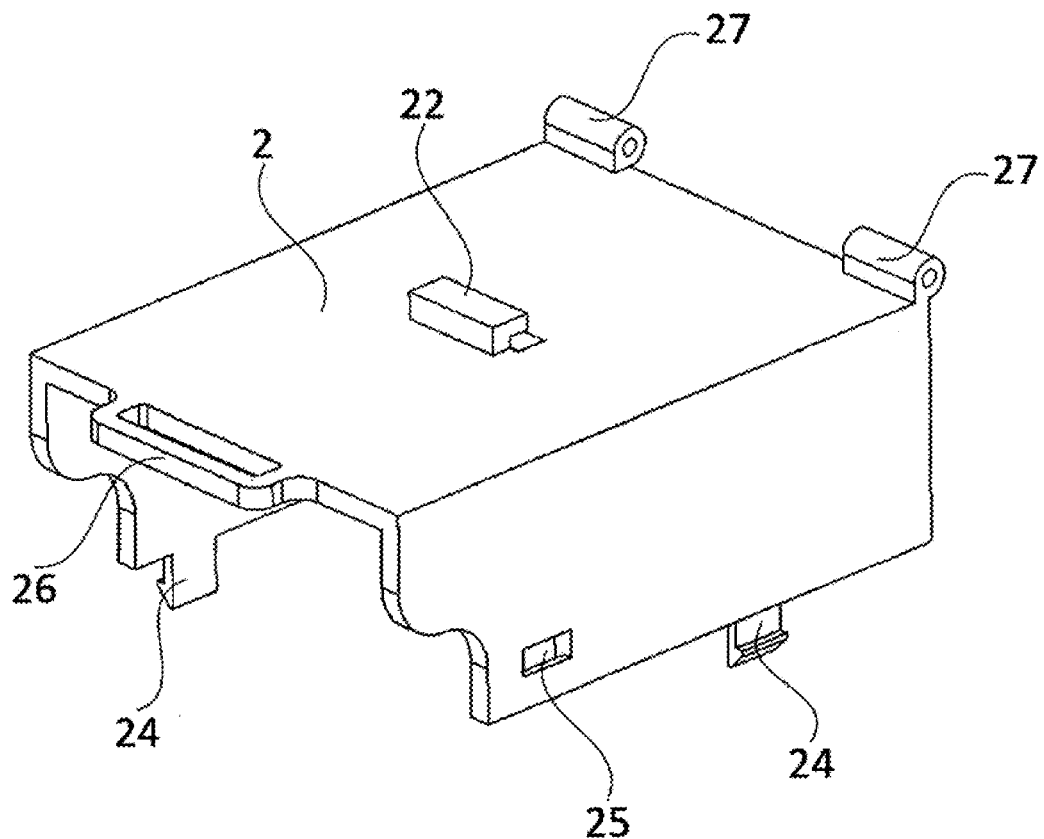
FIG. 7 is a schematic structural diagram of an upper housing of a rotary mounting cylinder.

As shown in FIGS. 2 and 7, one second rotating shaft cylinder 15 and two first rotating shaft cylinders 27 are provided, in which the one second rotating shaft cylinder 15 and the two first rotating shaft cylinders 27 pass through along the same straight line; the rotating shaft passes through the one second rotating shaft cylinder 15 and the two first rotating shaft cylinders 27 to realize hinge; and the positioning and connection base 1 and the rotary mounting cylinder 2 achieve hinge assembling. As shown in FIG. 2, there are distances between two ends of the second rotating shaft cylinder 15 and the first rotating shaft cylinders 27, respectively, such that the lifting elastic member 21 can be avoided and the spiral parts of the lifting elastic member 21 can be mounted.

In an embodiment of the present disclosure, a process of dismounting the fan is illustrated with reference to the process as shown in FIG. 3. FIG. 3 shows three different states, which are a working state, an intermediate state, and a maintenance state respectively from top to bottom. In the working state, the rotary mounting cylinder 2 is limited by the blocking and locking snap 11, the snap-fit flange 111 of the blocking and locking snap 11 fits the blocking and locking snap connecting handle 26 to block the rotary mounting cylinder 2 from lifting upwards, such that the rotary mounting cylinder 2 is kept in a locked state; and at this time, the rotary mounting cylinder 2 is in contact with the positioning and connection base 1. In this case, the fan is connected to a cable, and the fan can work normally. A cable connection structure is not shown in the drawings provided in the present disclosure.

When the fan needs to be removed, the unlocking block 13 is lifted upward to drive the blocking and locking snap 11 to be elastically deformed, and at this moment, the locking relationship between the blocking and locking snap 11 and the blocking and locking snap connecting handle 26 is released, the rotary mounting cylinder 2 is lifted upward under the action of the elastic force of the lifting elastic member 21, and the rotary mounting cylinder 2 drives the fan therein and the ejection sliding block 3 to rotate synchronously. When rotating to a certain angle, the ejection sliding block 3 can contact the main board (in cases where the positioning and connection base 1 is mounted on a bottom plate), at this time, the main board hinders the ejection sliding block 3, the ejection sliding block 3 moves relative to the rotary mounting cylinder 2; at this time, the ejection sliding block 3 pushes the fan to move synchronously, and pushes the fan out towards the pick-and-place end, and one end of the fan is pushed out from the rotary mounting cylinder 2. As the rotation angle of the rotary mounting cylinder 2 continuously increases, the length of the fan which is pushed out by the ejection sliding block 3 increases; and when the rotary mounting cylinder rotates to the maintenance state, the fan is pushed out by the ejection sliding block 3 to the maximum size; and at this time, an operator can hold the end of the fan by hand, and externally draw out the fan, thereby completing the picking process of the fan.

Correspondingly, a mounting process of the fan is opposite, firstly, the rotary mounting cylinder 2 is placed in the maintenance state, the fan is loaded into the rotary mounting cylinder 2, then the rotary mounting cylinder 2 is pressed, such that the rotary mounting cylinder 2 rotates downward, and the rotary mounting cylinder 2 compresses the lifting elastic member 21, and in this process, the ejection sliding block 3 is gradually separated from the main board; until the rotary mounting cylinder 2 reaches the working state, at this time, the rotary mounting cylinder 2 is snap-fitted and locked by the blocking and locking snap 11, the blocking and locking snap 11 blocks the fan, and the fan cannot move relative to the rotary mounting cylinder 2 along the axial direction; and after the fan is mounted in place, the fan is electrically connected, and the fan can work normally to drive air to flow.

An embodiment of the present disclosure further provides a server, including the fan module mounting device as described above. The server can achieve the described technical effects. For other parts of the structure of the server, reference can be made to the related art, and details will not be repeatedly described in the present disclosure.

The illustration above of the disclosed embodiments enable a person skilled in the art to implement or use the present disclosure. Various modifications to these embodiments will be apparent to a person skilled in the art. The general principles defined herein may be implemented in other embodiments without departing from the spirit or scope of the present disclosure. Accordingly, the present disclosure will not be limited to these embodiments shown herein, but needs to comply with the widest scope consistent with the principles and novel features disclosed herein.

What is claimed is:

1. A fan module mounting device, comprising a positioning and connection base (1) and a rotary mounting cylinder (2); wherein the positioning and connection base (1) is fixed inside a case, a bottom surface of a connecting end of the rotary mounting cylinder (2) is hinged to the positioning and connection base (1), the rotary mounting cylinder (2) can pivot around a rotating shaft parallel to the positioning and connection base (1), and two pivoting extreme positions of the rotary mounting cylinder (2) respectively correspond to a working state and a maintenance state;

a pick-and-place end of the rotary mounting cylinder (2) away from the rotating shaft is provided with a passage for a fan to enter and exit; the positioning and connection base (1) is provided with a blocking and locking snap (11); and in the working state, the blocking and locking snap (11) is snap-fitted with and limits the pick-and-place end of the rotary mounting cylinder (2), and blocks and limits the fan;

wherein the connecting end of the rotary mounting cylinder (2) is slidably provided with an ejection sliding block (3), wherein an inner end of the ejection sliding block (3) is provided with inner-end limiting stop blocks (34), and an outer end thereof is provided with an outer-end limiting stop block (35); and the inner end of the ejection sliding block (3) is in contact with the fan, and the outer end is in contact with the interior of the case and is retracted in the maintenance state, such that the fan can be ejected out.

2. The fan module mounting device according to claim 1, wherein one positioning and connection base (1) is assembled corresponding to one rotary mounting cylinder (2);
or multiple independently arranged rotary mounting cylinders (2) correspond to the same positioning and connection base (1).

3. The fan module mounting device according to claim 1, wherein the positioning and connection base (1) is a flat plate, and is provided with fixing and connecting holes (12) for assembling blind rivets; and the blocking and locking snap (11) protrudes upwards and is arranged at an edge of an upper surface of the positioning and connection base (1).

4. The fan module mounting device according to claim 3, wherein the fixing and connecting holes (12) are through holes passing through the positioning and connection base (1), and the passing directions of the fixing and connecting holes (12) are perpendicular to the flat plate surface of the positioning and connection base (1).

5. The fan module mounting device according to claim 4, wherein an upper edge of each fixing and connecting hole (12) is provided with a chamfer, and the chamfer is used to provide avoidance for a mounted blind rivet, such that an upper surface of the blind rivet is kept at the same height as the upper surface of the positioning and connection base (1).

6. The fan module mounting device according to claim 3, wherein a snap-fit flange (111) is arranged in the direction of the blocking and locking snap (11) facing away from the positioning and connection base (1);
the rotary mounting cylinder (2) is provided with a blocking and locking snap connecting handle (26) near the edge of the pick-and-place end of the positioning and connection base (1); and the snap-fit flange (111) and the blocking and locking snap connecting handle (26) cooperate to achieve limiting and locking.

7. The fan module mounting device according to claim 6, wherein an unlocking block (13) is provided in a direction of the blocking and locking snap (11) facing away from the positioning and connection base (1), and a vertical height of the unlocking block (13) is higher than that of the upper surface of the positioning and connection base (1).

8. The fan module mounting device according to claim 7, wherein the unlocking block (13) is of a cantilever structure, and the unlocking block (13) is arranged at a distance from the positioning and connection base (1).

9. The fan module mounting device according to claim 1, wherein an upper edge of the blocking and locking snap (11) is a smooth curved surface, and the width of the upper edge of the blocking and locking snap (11) gradually decreases from bottom to top.

10. The fan module mounting device according to claim 1, wherein a lifting elastic member (21) is arranged between the rotary mounting cylinder (2) and the positioning and connection base (1), and the lifting elastic member (21) provides an upward elastic force to the rotary mounting cylinder (2).

11. The fan module mounting device according to claim 10, wherein the lifting elastic member (21) is a torsion spring, first spring clamping blocks (14) for clamping the lifting elastic member (21) are arranged on the positioning and connection base (1), and a second spring clamping block (22) for clamping the lifting elastic member (21) is arranged on the bottom surface of the rotary mounting cylinder (2).

12. The fan module mounting device according to claim 1, wherein the outer-end limiting stop block (35) is annular, and the outer-end limiting stop block (35) is provided with at least one avoidance platform (351) for avoidance during rotation.

13. The fan module mounting device according to claim 12, wherein the avoidance platform (351) is flush with a cylindrical side surface of the outer-end limiting stop block (35), and the avoidance platform (351) on the side close to the positioning and connection base (1) is parallel to the surface of the positioning and connection base (1).

14. The fan module mounting device according to claim 1, wherein an axial ejection rod (31) protrudes from the center of the outer end of the ejection sliding block (3), and the tail end of the axial ejection rod (31) is provided with a spherical surface.

15. The fan module mounting device according to claim 1, wherein circumferential positioning pins (32) protrude from the inner side of the ejection sliding block (3), and the circumferential positioning pins (32) are used for being fitted with and inserted into connecting holes at an end of the fan.

16. The fan module mounting device according to claim 1, wherein a main body of the ejection sliding block (3) is in a hollow grid shape, translation guide blocks (33) protrude from the outer periphery of the ejection sliding block (3), and the connecting end of the rotary mounting cylinder (2) is provided with guide notches (23) fitting the translation guide blocks (33).

17. The fan module mounting device according to claim 1, wherein the rotary mounting cylinder (2) comprises an upper housing and a lower housing assembled with each other in a snap-fit manner.

18. The fan module mounting device according to claim 17, wherein the upper housing and the lower housing have the same structure, and the upper housing and the lower housing are respectively provided with connection snaps (24) and connection slots (25) which can cooperate with each other to achieve connection;
the upper housing and the lower housing are each provided with the blocking and locking snap connecting handle (26) fitting with the blocking and locking snap (11), and first rotating shaft cylinders (27) for insertion of the rotating shaft; and the upper surface of the positioning and connection base (1) is provided with a second rotating shaft cylinder (15).

19. A server, comprising a fan module mounting device, wherein the fan module mounting device comprises a positioning and connection base (1) and a rotary mounting cylinder (2); wherein the positioning and connection base (1) is fixed inside a case, a bottom surface of a connecting end of the rotary mounting cylinder (2) is hinged to the positioning and connection base (1), the rotary mounting cylinder (2) can pivot around a rotating shaft parallel to the positioning and connection base (1), and two pivoting extreme positions of the rotary mounting cylinder (2) respectively correspond to a working state and a maintenance state;
a pick-and-place end of the rotary mounting cylinder (2) away from the rotating shaft is provided with a passage for a fan to enter and exit; the positioning and connection base (1) is provided with a blocking and locking snap (11); and in the working state, the blocking and locking snap (11) is snap-fitted with and limits the pick-and-place end of the rotary mounting cylinder (2), and blocks and limits the fan;

wherein the connecting end of the rotary mounting cylinder (2) is slidably provided with an ejection sliding block (3), wherein an inner end of the ejection sliding block (3) is provided with inner-end limiting stop blocks (34), and an outer end thereof is provided with an outer-end limiting stop block (35); and the inner end of the ejection sliding block (3) is in contact with the fan, and the outer end is in contact with the interior of the case and is retracted in the maintenance state, such that the fan can be ejected out.

\* \* \* \* \*